United States Patent [19]
Bean et al.

[11] Patent Number: 4,725,870
[45] Date of Patent: Feb. 16, 1988

[54] SILICON GERMANIUM PHOTODETECTOR

[75] Inventors: John C. Bean, New Providence; Sergey Luryi, Millington; Thomas P. Pearsall, Summit, all of N.J.

[73] Assignee: American Telephone and Telegraph Company, AT&T Bell Laboratories, Murray Hill, N.J.

[21] Appl. No.: 799,153

[22] Filed: Nov. 18, 1985

[51] Int. Cl.$^4$ .............................................. H01L 27/12
[52] U.S. Cl. ............................................ 357/4; 357/13; 357/30; 357/16
[58] Field of Search ................ 357/4 SL, 30 A, 30 N, 357/16, 13

[56] References Cited

U.S. PATENT DOCUMENTS 3,626,257 12/1971 Esoki ................................ 357/4 SL
4,212,019  7/1980 Wataze ................................ 357/16
4,616,241 10/1986 Biefeld ............................. 357/4 SL

OTHER PUBLICATIONS

Capasso et al., *International Electron Device Meeting* Wash. D.C., (7–9 Dec. 1981), p. 284–IEDM 81.

Primary Examiner—Martin H. Edlow
Attorney, Agent, or Firm—Richard D. Laumann

[57] ABSTRACT

A photodetector, comprising a $Ge_xSi_{1-x}$ superlattice region between two silicon cladding layers in which the $Ge_xSi_{1-x}$ layers absorb light, is described.

7 Claims, 3 Drawing Figures

SILICON GERMANIUM PHOTODETECTOR

TECHNICAL FIELD

This invention relates generally to the field of photodetectors and particularly to such photodetectors using a silicon germanium composition as the absorbing medium.

BACKGROUND OF THE INVENTION

For many applications, including optical communication systems, photodetectors are required. Silicon is a widely used material for photodetectors but it has a bandgap of approximately 1.12 eV which restricts its utility to those applications in which radiation having a wavelength less than approximately 1.0 μm will be detected. Accordingly, for detection of radiation at wavelengths longer than 1.0 μm, other materials must be used. Materials commonly used include Ge and Group III-V compound semiconductors such as InGaAs.

For both p-i-n photodiodes and avalanche photodetectors, germanium is a less than ideal semiconductor because one should use its direct bandgap, 0.8 eV, for the absorption of radiation while the relatively small indirect bandgap, 0.66 eV, leads to large dark currents in typical device configurations. Additionally, because the ratio of the ionization coefficients is approximately 1.0, the rates at which the types of carriers ionize are not significantly different. This produces an intrinsically high noise level in an avalanche gain operating mode. As is well known to those skilled in the art, the lowest noise avalanche photodetectors arise when one type of carrier ionizes at a rate much greater than the other type of carrier, i.e., the ratio of the ionization coefficients differs significantly from 1.0. Group III-V compound semiconductors are not ideal for avalanche photodetectors because they also have a relatively small ratio of the ionization coefficients.

One approach to alleviating these problems in avalanche photodetectors involves the use of separate absorption and multiplication regions. The incident light is absorbed in a relatively small bandgap region and avalanche multiplication occurs in a relatively large bandgap region. One such photodetector is described in U.S. Pat. No. 4,212,019, issued on July 8, 1980 to Wataze et al. In one embodiment, his Example 3, the multiplication region comprised a p-type silicon layer and the absorption region comprised a p-type $Ge_xSi_{1-x}$ layer. In another embodiment which is depicted in his FIG. 2, the multiplication and absorption regions are not clearly defined but rather, the composition of the $Ge_xSi_{1-x}$ region is gradually varied. The detailed description states that the composition varies from pure Ge at the edge of the absorption region to pure Si at the edge of the multiplication region.

However, a detailed consideration of this disclosure by one skilled in the art reveals that the devices described are not suitable for use as photodetectors at wavelengths longer than approximately 1.2 μm. In particular, they are not suitable for use as photodetectors in the 1.3 to 1.6 μm wavelength range presently of interest for optical communication systems using silica-based fibers. This range is of interest because it includes the regions of lowest loss and minimum dispersion in the fiber. The limited utility, with respect to wavelength, of the avalanche photodetector arises because Ge and Si are indirect bandgap materials and a relatively thick GeSi absorbing layer is required for high quantum efficiency. In fact, an approximately 50 to 100 μm layer will be required for most incident light to be absorbed. However, the structure disclosed cannot have a thick, high quality $Ge_xSi_{1-x}$ absorbing layer on the silicon substrate because of the large lattice mismatch between the absorbing layer and the underlying silicon substrate. This lattice mismatch will inevitably result in a large number of defects, e.g., misfit dislocations, which will certainly preclude operation of the device as an avalanche photodetector. Additionally, even if the structure were fabricated without defects, it would not be useful for high speed communications applications because the photogenerated carriers would have to travel distances of the order of 50 μm to reach the contacts. This would result in a response time of the order of a nanosecond.

SUMMARY OF THE INVENTION

We have found that a photodetector comprising a first cladding layer; an interleaved region of alternating $Ge_ySi_{1-y}$ and $Ge_xSi_{1-x}$ layers, x greater than 0.0 and less than or equal to 1.0 and y greater than or equal to 0.0 and less than 1.0; and a second cladding layer is a useful photodetector at wavelengths longer than 1.0 μm. In a preferred embodiment, both cladding layers comprise Si. In another preferred embodiment, the first silicon layer has p-type conductivity, and the second silicon layer has n-type conductivity. In still another embodiment, the device further comprises a third silicon layer having intrinsic conductivity between the n-type layer and the superlattice. The alloy layers in the interleaved region are normally undoped and the device operates as an avalanche photodetector with electrons, photogenerated in a GeSi layer, initiating the avalanche process in a silicon cladding region. There may be a fourth p-type silicon layer between the interleaved region and the intrinsic conductivity layer. The fourth layer is depleted during device operation and yields the desired high-low electric field configuration for the absorption and multiplication regions. In a preferred embodiment, edge coupling of the light into the interleaved region is used to obtain greater absorption than is possible with vertical illumination. The waveguiding effect of the superlattice further increases the absorption efficiency by increasing the optical path length. This is accomplished, however, without a dramatic increase in the spacing between the p- and n-type layers. A fast response time is retained. In yet another embodiment, grating assisted coupling is used to introduce the light into the superlattice region.

Figure 1:
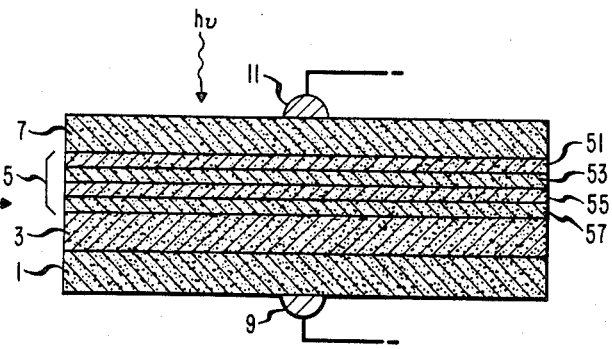
FIG. 1 is a view of one embodiment of this invention.

For reasons of clarity, the elements of the devices depicted are not drawn to scale.

DETAILED DESCRIPTION

The invention will first be described by reference to the exemplary embodiment depicted in FIG. 1. The structure comprises a substrate 1, a first silicon layer 3 having a first conductivity type; an interleaved region 5 comprising a superlattice region having alternating layers of $Ge_xSi_{1-x}$ and Si; and a second silicon layer 7 having a second conductivity type. In a preferred embodiment, the first conductivity type is n-type. The superlattice region has a thickness $h_{SL}$ and comprises a plurality of alternating, i.e., interleaved $Ge_xSi_{1-x}$ and Si layers indicated as 51, 53, 55 and 57. For reasons of clarity only 4 layers are depicted. More will typically be present. Each period, i.e., one $Ge_xSi_{1-x}$ and one Si layer, has a thickness T and the $Ge_xSi_{1-x}$ alloy layer has a thickness $h_a$.

Although photodetectors having only a single alloy layer are possible, they are not as desirable as those having a superlattice region because the effective absorption coefficient would be so low that the absorbing region would require a horizontal dimension of several centimeters assuming edge coupling. Of course, the resulting high capacitance is undesirable. Vertical illumination would be unlikely to yield a useful embodiment. The precise value of x selected for the superlattice layers is determined by the desire to absorb light at a specific wavelength. It is generally desirable, for a waveguide configuration, to grow the superlattice region as thick as possible provided, of course, that stability against dislocation formation is maintained. It should be noted that a superlattice thicker than approximately 3000 Angstroms may be deleterious as it may yield multimode waveguide behavior and undesirable dispersion. Each alloy layer within the superlattice region can be grown as thick as possible subject, of course, to the caveat that the growth should remain commensurate.

It will be readily appreciated that, in general, the interleaved region comprises alternating layers of $Ge_xSi_{1-x}$ and $Ge_ySi_{1-y}$, y greater than 0.0 and less than or equal to 1.0 and y greater than or equal to 0.0 and less than 1.0, with x being greater than y. If x and y are constant, the interleaved region is a superlattice. Of course, x and y may vary within the interleaved region. Such variations may lead to stronger waveguiding due to refractive index variations within the superlattice.

The structure depicted can be grown by what are now conventional and well-known Si molecular beam epitaxy techniques. The thickness and composition of the superlattice layers are selected, together with the growth conditions, so that good crystal quality, that is, a small number of misfit dislocations, is maintained during crystal growth. As the subscript x increases, that is, as the Ge content increases, the lattice mismatch between the alloy layer and the silicon layer becomes greater and the maximum attainable thickness of the alloy layer becomes smaller. The mismatch is accommodated by strain. These relationships are described in U.S. Pat. No. 4,529,455 issued on July, 16, 1985 to John C. Bean, Leonard C. Feldman, and Anthony T. Fiory, which is incorporated herein by reference. The attainable superlattice thickness is determined by taking the average value of x in the superlattice for one period, i.e., the superlattice thickness is determined by treating it as having a misfit equal to the misfit average of a single period. Contacts can be fabricated by well-known techniques.

As will be readily appreciated by those skilled in the art, as the subscript x increases, the bandgap decreases and the superlattice alloy regions are capable of absorbing light at ever longer wavelengths. However, the $Ge_xSi_{1-x}$ absorbing layers will become progressively thinner and accordingly, greater number of such layers will be required in the superlattice region to obtain a generally complete absorption of the incident light for vertical illumination. A possible practical limitation to the superlattice region thickness arises because of the presently relatively slow growth rate attainable with molecular beam epitaxy.

The incident light is absorbed in the $Ge_xSi_{1-x}$ layers within the superlattice regions. The device may be used as an avalanche photodetector. The minority carrier electrons drift to the Si n-type region and undergo avalanche multiplication. This a is desirable configuration because electrons have a higher ionization rate than do holes in silicon.

It is contemplated that the light will be edge coupled into the embodiment depicted in FIG. 1, i.e., the light is coupled directly into the superlattice region. Of course, the incident light will generally have an intensity distribution centered on the superlattice region but also extending into the adjacent silicon layers. Again, a thicker superlattice region will be desirable to maximize absorption. The $Ge_xSi_{1-x}$ layers have a refractive index higher than that of the silicon layers, and accordingly, the incident light is guided within the alloy layers. This gives an absorbing distance which is effectively quite large and is limited only by the horizontal extent of the $Ge_xSi_{1-x}$ layers. The device is thus useful at longer wavelengths than it is for the vertical illumination as the superlattice region can be made thinner for comparable absorption. However, the coupling of light from the optical fiber into the superlattice region is quite likely to be less efficient for the edge coupled embodiment than it is for the vertical illumination embodiment.

Figure 2:
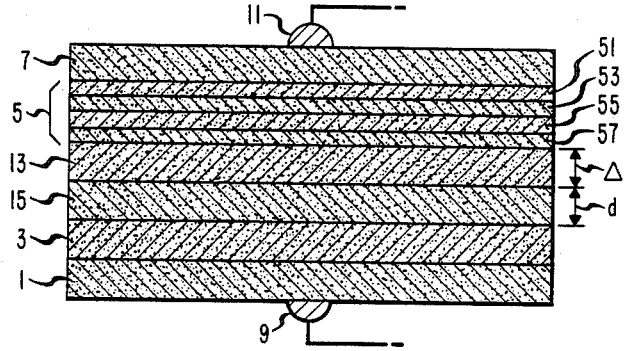
FIG. 2 is a depiction of an embodiment of this invention using edge coupling.

Another embodiment of a photodetector according to this invention is depicted in FIG. 2. Numerals identical to those used in FIG. 1 represent identical elements. The device further comprises a third silicon layer having p-type conductivity and a thickness Δ and a fourth silicon layer having intrinsic conductivity and a thickness d. The third layer is adjacent the superlattice region and the fourth layer is adjacent the third layer. The third layer is relatively thin, generally less than $10^{-4}$ cm, and is depleted during operation by the applied reverse bias. Calculation of appropriate doping levels will be easily done by those skilled in the art. The device should have a high-low electric field configuration, i.e., the absorption and multiplication regions have a low and high, respectively, electric field.

Several factors should be considered in choosing appropriate device parameters to reduce the excess noise. For example, electrons should initiate the avalanche process for reasons already discussed. The electric field in the avalanche region should be near threshold and the avalanche region should be much thicker than the inverse of the ionization coefficient. Additionally, the electric field in the superlattice region should not exceed the ionization threshold for germanium, otherwise impact in the dark and thus, additional noise will result.

Figure 3:
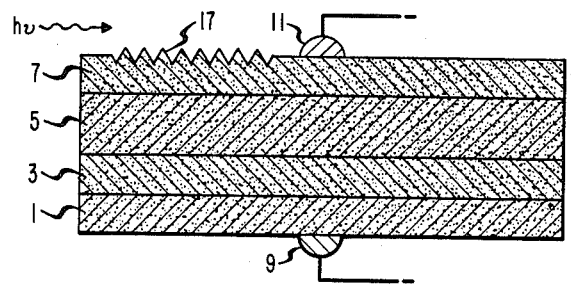
FIG. 3 is an embodiment of this invention using grating assisted coupling.

Some of the difficulties in the edge coupling embodiment may be avoided by use of the embodiment depicted in FIG. 3. Numerals identical to those in FIG. 1 represent identical elements. Shown in FIG. 3 is a grating-assisted coupling scheme which reference numerals identical to those in FIG. 1, represent identical elements. As can be seen, the device further comprises a grating 17 etched on the surface of the top silicon layer. The period and other details of the grating coupler are well known to those skilled in the art and need not be repeated here. Fabrication techniques are also well known to those skilled in the art. As depicted, the light can be incident from the top surface rather than from the side of the detector. This position facilitates coupling of the photodetector to the incident light as positioning of the optical fiber is typically easier when positioned with respect to the top surface than with respect to the superlattice region.

Still, other embodiments will be readily thought of by those skilled in the art. For example, the cladding layer farthest from the substrate may comprise Ge.

What is claimed is:

1. A photodetector comprising a first cladding layer of silicon having a first conductivity type;

an interleaved region comprising alternating layers of $Ge_xSi_{1-x}$ and $Ge_ySi_{1-y}$, x greater than 0.0 and y and less than or equal to 1.0, y greater than or equal to 0.0 and less than than 1.0; and a second cladding layer having a second conductivity type.

2. A photodetector as recited in claim 1 in which said second cladding layer comprises silicon.

3. A photodetector as recited in claim 2 in which x and y are constant.

4. A photodetector as recited in claim 1 in which said first conductivity type is p-type.

5. A photodetector as recited in claim 4 further comprising a third layer of silicon having intrinsic conductivity and being between said second layer and said superlattice.

6. A photodetector as recited in claim 5 further comprising a fourth layer of silicon having a first conductivity type and being between said third layer and said superlattice.

7. A photodetector as recited in claim 1 further comprising a grating on said second layer of silicon.

* * * * *